US 6,949,465 B2

(12) United States Patent
Aoki et al.

(10) Patent No.: US 6,949,465 B2
(45) Date of Patent: Sep. 27, 2005

(54) PREPARATION PROCESS FOR SEMICONDUCTOR DEVICE

(75) Inventors: Hidemitsu Aoki, Kanagawa (JP); Kenichi Tokioka, Kanagawa (JP); Yoshiko Kasama, Kanagawa (JP); Tatsuya Koito, Kanagawa (JP); Keiji Hirano, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/614,971

(22) Filed: Jul. 9, 2003

(65) Prior Publication Data

US 2004/0009658 A1 Jan. 15, 2004

(30) Foreign Application Priority Data

Jul. 10, 2002 (JP) .................................... 2002-201901

(51) Int. Cl.$^7$ ............................................ H01L 21/302
(52) U.S. Cl. ..................................... 438/689; 438/758
(58) Field of Search ................................ 438/689, 758, 438/906; 134/1.3

(56) References Cited

U.S. PATENT DOCUMENTS

| 6,091,130 | A | * | 7/2000 | Oyamatsu et al. | 257/619 |
| 6,149,828 | A | * | 11/2000 | Vaartstra | 216/57 |
| 6,277,749 | B1 | * | 8/2001 | Funabashi | 438/689 |
| 6,465,403 | B1 | * | 10/2002 | Skee | 510/175 |
| 6,602,787 | B2 | * | 8/2003 | Komai et al. | 438/687 |
| 6,805,139 | B1 | * | 10/2004 | Savas et al. | 134/1.3 |

* cited by examiner

*Primary Examiner*—Michael Lebentritt
*Assistant Examiner*—Olivia T Luk
(74) *Attorney, Agent, or Firm*—McGinn & Gibb, PLLC

(57) ABSTRACT

According to this invention, residues generated after selectively removing a low-dielectric-constant film such as SiOC can be effectively removed without damage on an insulating film or metal film. Specifically, residues 126 and 128 generated after forming an interconnect trench in an SiOC film 116 are removed using a fluoride-free weak alkaline amine stripper. After the removing step, the wafer is rinsed with isopropyl alcohol and then dried without drying with pure water.

25 Claims, 12 Drawing Sheets

FIG. 2A (Plug-forming part)     (Non-plug-forming part)

FIG. 3A (Plug-forming part)    (Non-plug-forming part)

FIG. 4A (Plug-forming part)

(Non-plug-forming part)

F-containing stripper    Amine stripper

Before treatment

Remaining within the hole

After treatment with Remover NO.4

Residues

After treatment with Remover NO.1

No residues

PREPARATION PROCESS FOR SEMICONDUCTOR DEVICE

This application is based on Japanese patent application NO. 2002-201901, the content of which is incorporated hereinto by reference.

BACKGROUND OF THE INVENTION

1. Field of the Invention

This invention relates to a technique for removing a residue generated by, for example, etching in a process for preparing a semiconductor device comprising a low-dielectric-constant film.

2. Description of the Related Art

Recently, in response to requirement for operation of a semiconductor device at a higher speed, a copper with a lower resistance has been used as an interconnection material while in the light of reducing a parasitic capacitance between interconnections, a so-called low-dielectric-constant film has been employed as an interlayer insulating film material. The term "low-dielectric-constant film" refers to a film made of a material having a lower dielectric constant than $SiO_2$, generally a film with a specific dielectric constant of 4 or less.

There have been intense attempts for developing utilities of a film formed by an application process such as HSQ (hydrogen silsesqueoxane) or MSQ (methyl silsesqueoxane) as a low-dielectric-constant film as described above. However, for such a film, the film may be partially dissolved due to moisture absorption during a semiconductor process, or a stress may be generated in the film by heating, leading to, defective interlayer adhesiveness.

Thus, there have been conducted intense application studies for a low-dielectric-constant film formed by CVD. Among others, SiOC exhibits a relatively stable specific dielectric constant (about 2.8) even after a high-temperature process, and is therefore promising as an interlayer insulating film material for a semiconductor device comprising copper interconnections.

SUMMARY OF THE INVENTION

We, however, have found that when using SiOC as an interlayer insulating film material, various phenomena which have not known in a conventional insulating film material. For example, in a semiconductor process comprising the sequential steps of:

(i) forming a copper film on a semiconductor substrate, on which is then formed an SiOC film;

(ii) forming a resist on the SiOC film and using the resist as a mask to form a hole by dry etching to expose a copper film surface;

(iii) removing the resist by ashing;

(iv) cleaning the inside of the hole with a stripper; and (v) rinsing the product, the side wall of,the hole may be etched during the step (iv) so that a desired shape cannot been formed. Furthermore, during rinsing with pure water during the step (v), a part of the copper film may be dissolved or in extreme cases, an abrupt reaction in the copper surface may form a dendrite extrusion.

Thus, an object of this invention is to provide a technique whereby a residue generated during selectively removing a low-dielectric-constant film made of, for example SiOC can be effectively removed without any problem described above or damage on the insulating film or metal film.

This invention which can solve the above problems provides a process for manufacturing a semiconductor device comprising the steps of forming an SiOC-containing insulating film on a semiconductor substrate, and then selectively removing the insulating film; and removing the residue generated during the previous step with a fluoride-free weak alkaline stripper.

This invention also provides a process for manufacturing a semiconductor device comprising the steps of forming an insulating film having a specific dielectric of 4 or less on a semiconductor substrate by CVD or sputtering, and then selectively removing the insulating film; and removing the residue generated during the previous step with a fluoride-free weak alkaline stripper. The insulating film may comprise silicon and carbon as constituent elements.

According to the above manufacturing process, a fluoride-free weak alkaline stripper is used. Thus, the residue generated during selective removal of the insulating film can be effectively removed without damage on the insulating film. If the stripper contains fluoride ions, the insulating film may be often damaged. Furthermore, if the stripper is strong alkaline or acidic, it is difficult to effectively remove the residue without damage on the insulating film.

This invention also provides a process for manufacturing a semiconductor device comprising the steps of forming a copper-containing metal film and then an SiOC-containing insulating film on a semiconductor substrate; selectively removing the insulating film to form a concave such that a part of the copper-containing film is exposed; and removing a residue generated during selective removal of the insulating film with a fluoride-free weak alkaline stripper.

This invention also provides a process for manufacturing a semiconductor device comprising the steps of forming a copper-containing metal film on a semiconductor substrate and then an insulating film having a specific dielectric constant of 4 or less by CVD or sputtering; selectively removing the insulating film to form a concave such that a part of the copper-containing film is exposed; and removing a residue generated during selective removal of the insulating film with a fluoride-free weak alkaline stripper.

According to the above manufacturing process, a fluoride-free weak alkaline stripper is used. Thus, the residue generated during selective removal of the insulating film can be effectively removed without damage on the insulating film and the copper-containing metal film. If the stripper contains fluoride ions, the insulating film may be often damaged. Furthermore, if the stripper is strong alkaline or acidic, it is difficult to effectively remove the residue without damage on the insulating film. In the manufacturing process, a "copper-containing film" refers to a copper film or a film containing copper as a major component. In addition to copper, other metals such as Sn, Al, Ti, Ag, Ni and Mg may be contained as minor components.

The step of selectively removing the insulating film in this invention may comprise forming a resist having an opening on the insulating film; selectively removing the insulating film using the resist as a mask; and then removing at least part of the resist by ashing. Although a hole or trench may be formed in the insulating film in a well-controlled manner by employing such a process, ashing may lead to a damaged part, which may be then side-etched during the subsequent stripper treatment, and thus a hole or trench having a desired shape cannot be formed. In this regard, this invention employs a fluoride-free weak alkaline stripper during removal of the residue. Therefore, a damaged part due to ashing is little etched by a stripper, resulting in a hole or trench as originally designed.

The process for manufacturing a semiconductor device according to this invention may further comprise a step of rinsing the product using a non-aqueous rinse agent alone after the above step of removing the residue. After removing the residue with a stripper, rinsing is conducted usually for washing the stripper out. The rinsing step has been generally conducted with pure water when using a hydrofluoric acid stripper while being conducted with IPA and then with pure water when using a strong alkaline stripper. We have, however, found after investigation that (i) a strong alkaline stripper may cause side etching of a damaged part generated by, for example, ashing; and that (ii) a hydrofluoric acid stripper may dissolve a part of a copper film during rinsing with pure water required for washing the stripper out, or in extreme cases, form a dendrite extrusion on the copper surface. The above (i) will be later described in Examples. Thus, the phenomenon of the above (ii) will be described below.

Our studies have indicated that, for example, when the copper-containing metal film and the SiOC film both of which are exposed are in contact with water, it tends to cause the dissolution of the copper film from the surface or the forming of a dendrite. It is probably because electric charge accumulated in, for example, the SiOC film during the semiconductor process interacts with water. Such a phenomenon becomes marked when a copper-containing metal film is buried in an insulating film so that there are no leak paths for electric charge to the outside, or when the surface of the copper-containing film exposed in a hole bottom may be in contact with water.

For preventing dissolution of a copper film or generation of a dendrite, it is desirable to conduct rinsing without water. However, in rinsing without water, remaining of the stripper becomes significant. This invention, therefore, employs a fluoride-free weak alkaline stripper. It may effectively prevent remaining of the stripper after rinsing. That is, this invention can prevent production problems such as dissolution of a copper film or dendrite formation while preventing remaining of a stripper after rinsing.

A stripper in this invention may preferably have pH within a range of more than 7 and 11 or less, resulting in prevention of dissolution of a modified part in an insulating film by the stripper, dissolution of the copper film or dendrite formation. Furthermore, even when only a non-aqueous rinsing agent is used for rinsing, remaining or precipitation of the stripper after rinsing can be minimized.

This invention is more effective when an insulating film comprises SiOC. SiOC exhibits a relatively stable specific dielectric constant (about 2.8) even after a high-temperature process. It may, however, be damaged by a stripper or when being used in combination with a copper film, may cause dissolution of the copper film or generation of a dendrite. In this invention, such problems can be solved so that excellent advantages of SiOC may be effectively utilized. The term "insulating film comprising SiOC" as used herein encompasses both insulating films consisting of SiOC and partially comprising an SiOC structure.

This summary of the invention does not necessarily describe all necessary features so that the invention may also be a sub-combination of these described features.

DETAILED DESCRIPTION OF THE INVENTION

The invention will now be described based on the preferred embodiments. This does not intend to limit the scope of the present invention, but exemplify the invention.

Figure 5:
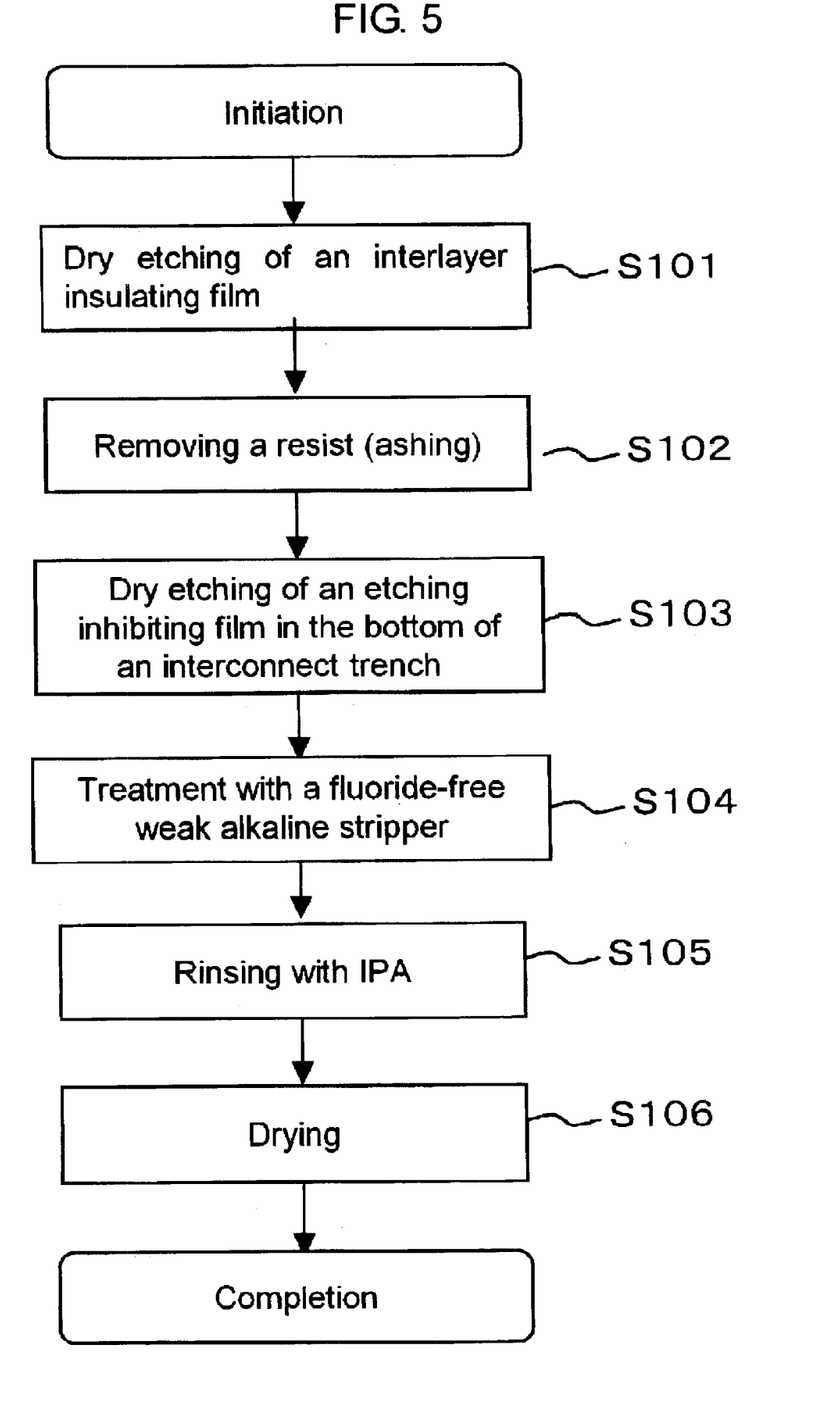
FIG. 5 is a flow diagram illustrating a process for manufacturing a semiconductor device according to this invention.

FIG. 5 shows a specific procedure of a manufacturing process for a semiconductor device according to this invention. First, on a semiconductor substrate are deposited an etching inhibiting film and an interlayer insulating film, on which is formed a resist with a given pattern. Using the resist as a mask, the interlayer insulating film is dry-etched to form an interconnect trench (S101). Then, the resist is removed by ashing (S102), and the etching inhibiting film on the bottom of the interconnect trench is removed by dry etching (S103). Then, the inside of the interconnect trench is treated with a fluoride-free weak alkaline stripper containing a removing ingredient (S104). The wafer is rinsed with IPA (isopropyl alcohol) (S105), and is then dried without rinsing with pure water (S106). An embodiment of a manufacturing process for a semiconductor device comprising such a procedure will be described with reference to process cross sections.

Figure 1A:
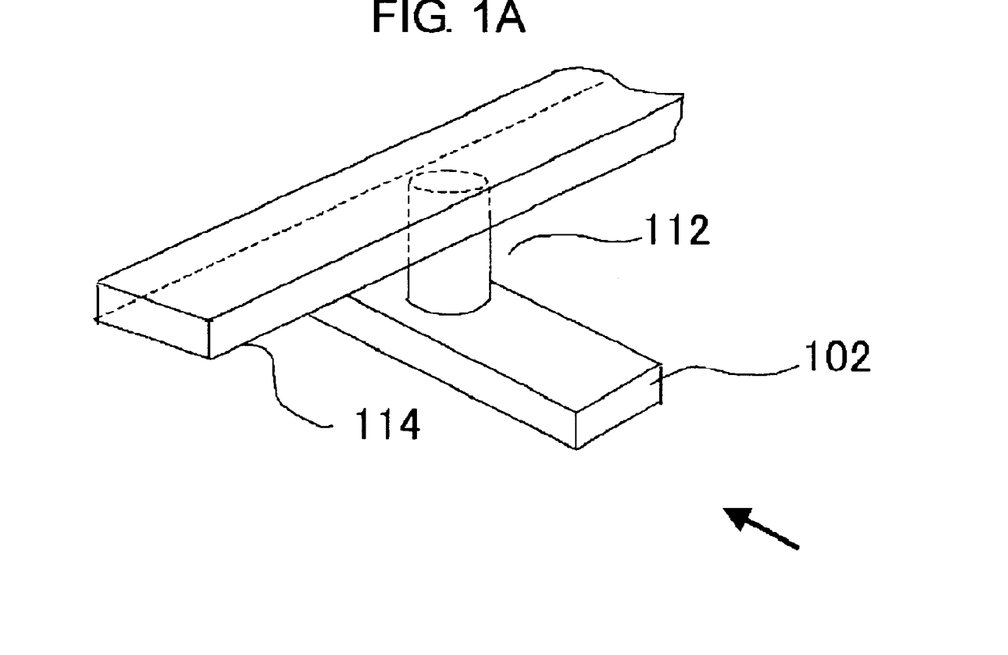
FIG. 1A shows an example of an interconnection structure obtained by a process for manufacturing a semiconductor device according to this invention.
Figure 1B:
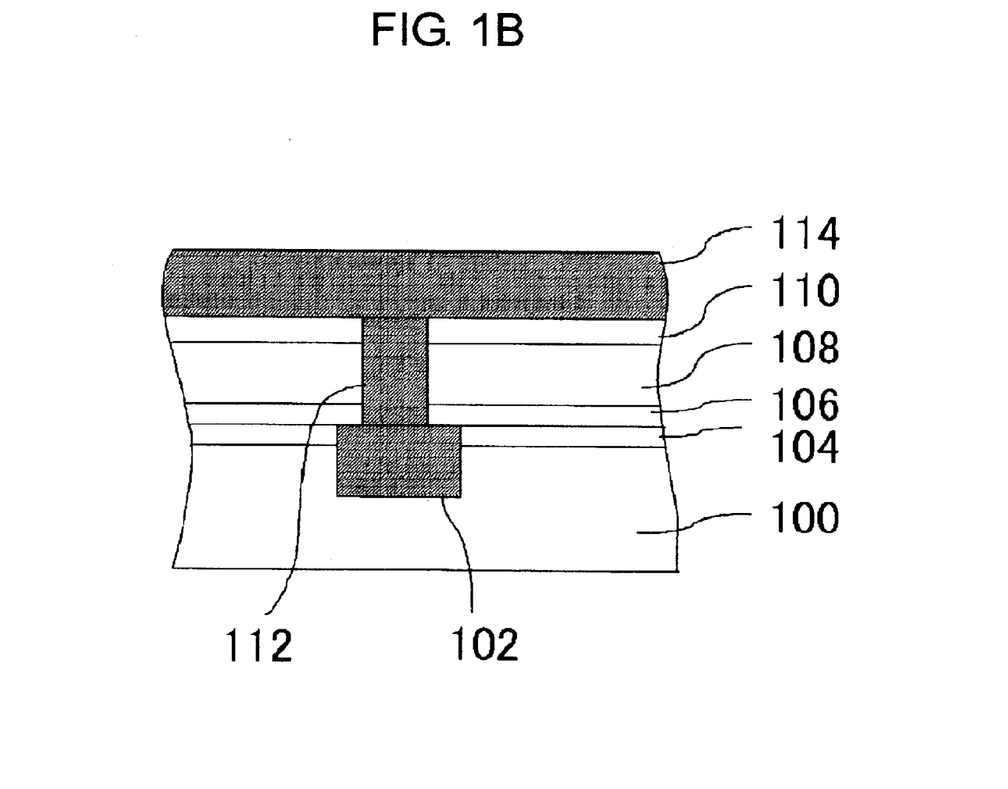
FIG. 1B shows an example of an interconnection structure obtained by a process for manufacturing a semiconductor device according to this invention.

FIG. 1A schematically shows a multi-layer interconnection structure where an upper copper interconnection 114 is formed on a lower copper interconnection 102, and the lower copper interconnection 102 is connected with the upper copper interconnection 114 through a via plug 112. FIG. 1B is a cross section of the multi-layer interconnection in FIG. 1A from the direction indicated by an arrow. As shown in FIG. 1B, an SiOC film 100, an $SiO_2$ film 104, an SiCN film 106, an SiOC film 108 and an $SiO_2$ film 110 are sequentially formed. The lower copper interconnection 102 is formed in a multilayered film, consisting of the SiOC film 100 and the $SiO_2$ film 104 while the via plug 112 is formed in a multilayered film consisting of the SiCN film 106, the SiOC film 108 and the $SiO_2$ film 110. Furthermore, the copper interconnection 114 is formed such that it is connected with the upper surface of the via plug 112. There will be described an embodiment where a process according to this invention is applied to formation of the part above the via plug 112 in this interconnection structure.

In FIGS. 2A to 3B, the left and the right sides show a plug(via plug 112)-forming part and a non-plug-forming part, respectively. Specifically, the left side shows a cross section of a part of the upper copper interconnection 114 in FIG. 1A which is in contact with the via plug 112, while the right side shows a cross section of a part of the upper copper interconnection 114 which is not in contact with the via plug 112.

Figure 2A:
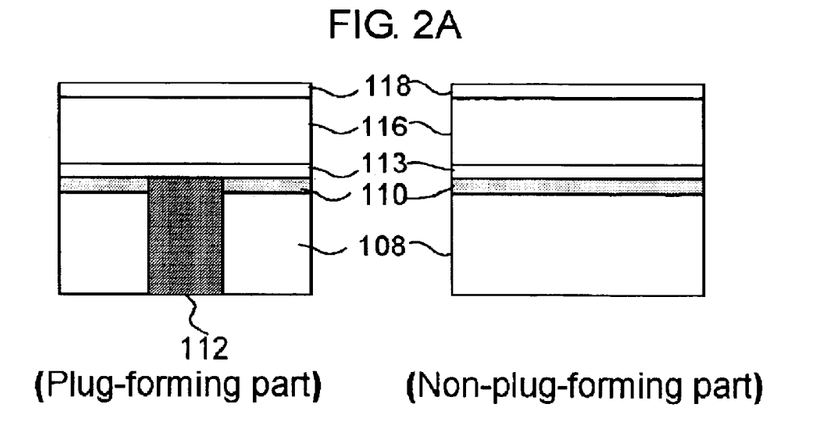
FIG. 2A is a process cross section illustrating a process for manufacturing a semiconductor device according to this invention.

First, as shown in FIG. 2A, on the semiconductor substrate are formed the SiOC film 108 and the $SiO_2$ film 110. In the multilayered film is formed a via plug 112, and then on the surface are sequentially deposited an SiCN film 113, an SiOC film 116 and an $SiO_2$ film 118.

Figure 2B:
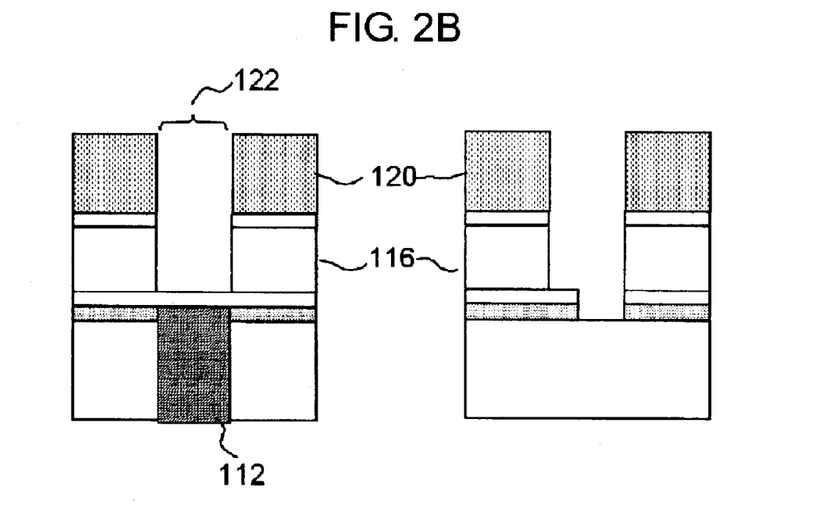
FIG. 2B is a process cross section illustrating a process for manufacturing a semiconductor device according to this invention.

Then, on the $SiO_2$ film 118 is formed a resist 120 with a given opening. Using the resist as a mask, the SiOC film 116 is dry-etched to form an interconnect trench 122 (FIG. 2B). In the non-plug-forming part in FIG. 2B, the SiCN film 113 and the $SiO_2$ film 110 are partially opened and thus the SiOC film 108 is exposed. It is because during the step of forming the interconnect trench 122, the film is overetched so that openings are formed in parts of the SiCN film 113 and the $SiO_2$ film 110.

Figure 2C:
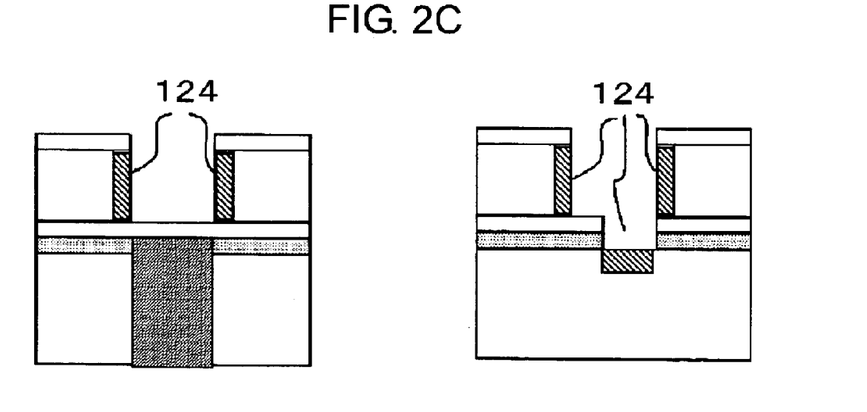
FIG. 2C is a process cross section illustrating a process for manufacturing a semiconductor device according to this invention.

Then, ashing by oxygen plasma is conducted to remove the resist 120 (FIG. 2C). In this process, the SiOC film 116 and the SiOC film 108 exposed in the interconnect trench is modified to generate a modified layer 124. Although the mechanism whereby the modified 124 is formed is not clearly understood, it would be caused by reaction of O (oxygen) in oxygen plasma with C in SiOC.

Then, the SiCN film 113 in the bottom of the interconnect trench is removed by dry etching (FIG. 3A) to expose the upper surface of the via plug 112 in the bottom of the interconnect trench. This etching allows residues 126 and 128 to adhere to the inside of the interconnect trench. Treatment with a stripper is conducted for removing these residues. In this embodiment, fluoride-free weak alkaline amine stripper is used. An "amine stripper" is a stripper containing an amine compound having an amino group as an essential component and a solvent used may be water or a hydrophilic solvent. The stripper may contain an anticorrosive as appropriate. In this embodiment, such a stripper may be used to prevent side etching of SiOC in the trench and to significantly reduce residues during a subsequent rinsing process.

Figure 4A:
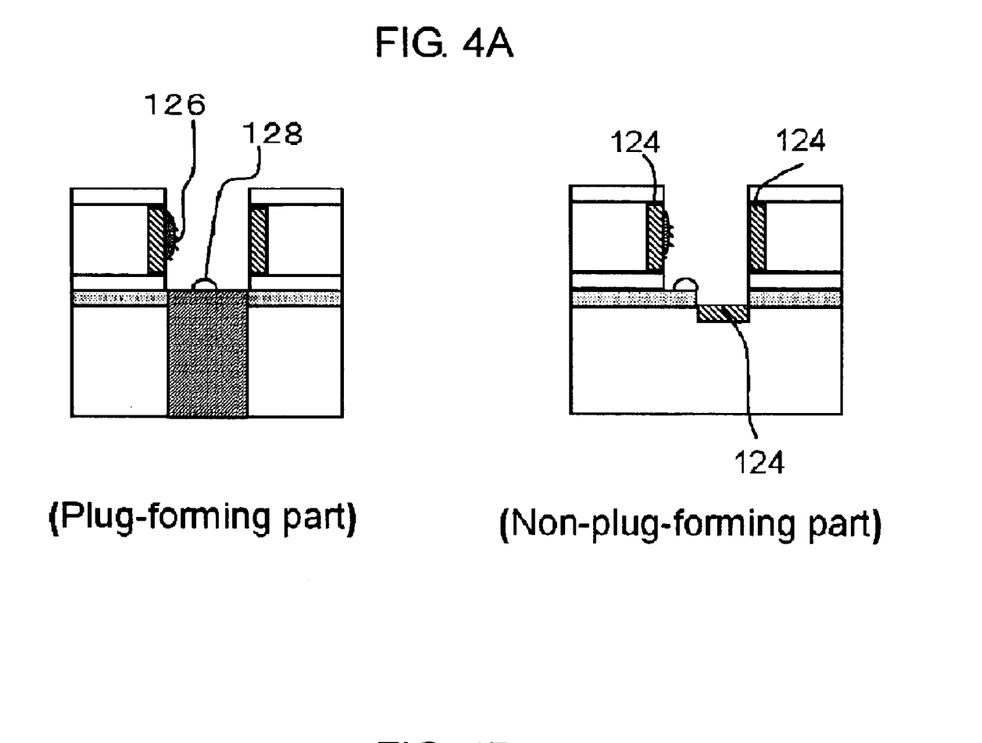
FIG. 4A is a process cross section illustrating a process for manufacturing a semiconductor device using a hydrofluoric acid stripper.
Figure 4B:
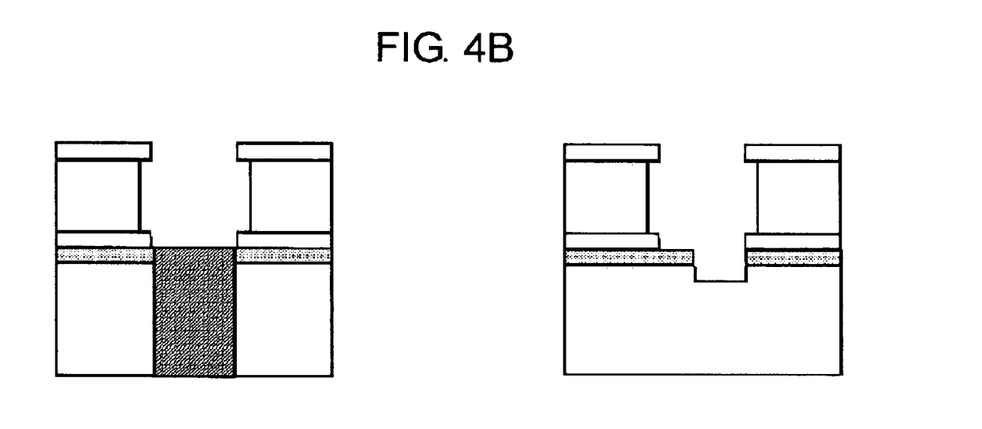
FIG. 4B is a process cross section illustrating a process for manufacturing a semiconductor device using a hydrofluoric acid stripper.

In contrast, when using a solution containing ammonium fluoride instead of the above amine stripper, side etching proceeds in an interconnect trench during dry etching for forming the trench so that an interconnect trench having a desired shape may not be formed. FIG. 4A and FIG. 4B show such the situation. When the wafer is treated with the solution containing ammonium fluoride as a stripper in the step shown in FIG. 4A, the modified layer 124 is dissolved in the stripper. As a result, side etching of the SiOC film 116 shown in FIG. 4B proceeds so that an interconnect trench having designed dimensions cannot be formed. Although the mechanism whereby the stripper dissolves the modified layer 124 is not clearly understood, the modified layer 124 may be probably converted to have a structure similar to $SiO_x$.

Figure 3A:
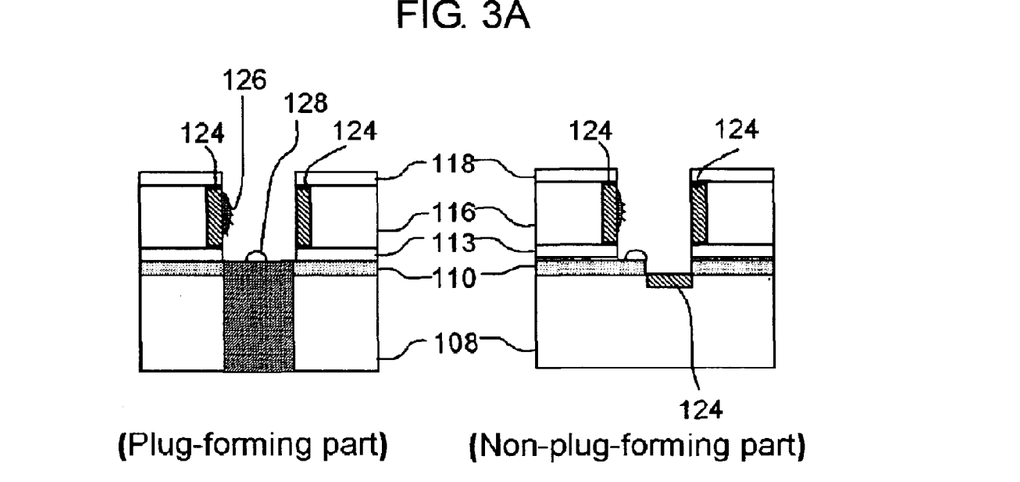
FIG. 3A is a process cross section illustrating a process for manufacturing a semiconductor device according to this invention.
Figure 3B:
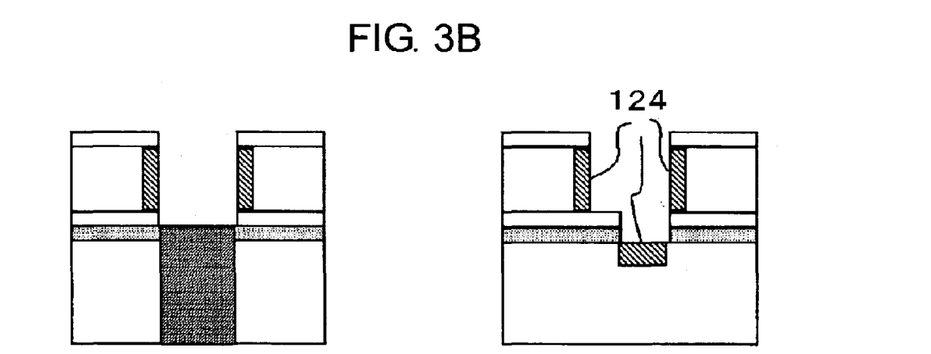
FIG. 3B is a process cross section illustrating a process for manufacturing a semiconductor device according to this invention.
Figure 3C:
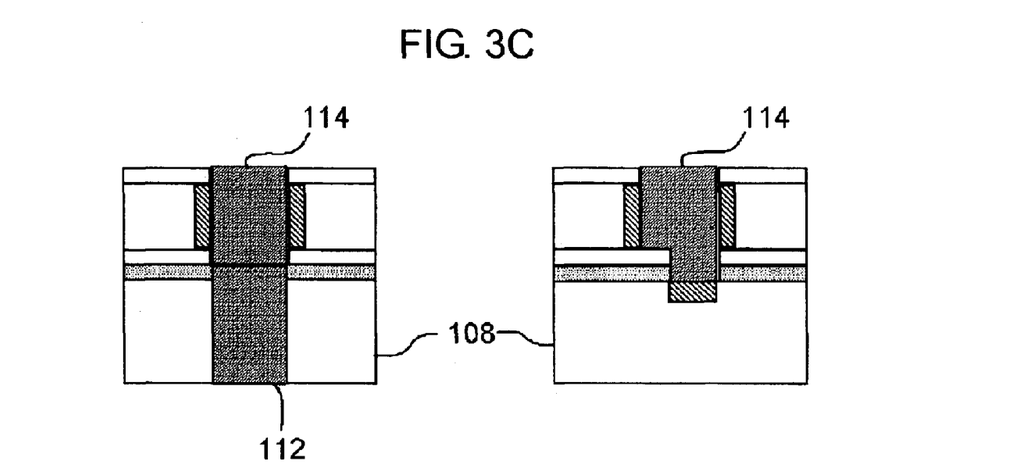
FIG. 3C is a process cross section illustrating a process for manufacturing a semiconductor device according to this invention.

Again referring to FIG. 3A, the above treatment for removing the residues in the interconnect trench gives the state as shown in FIG. 3B. Then, a copper film is formed by a damascene process such that it fills the interconnect trench, and the excessive copper film outside the trench is removed to form an upper copper interconnection 114 (FIG. 3C). Thus, a copper multilayer interconnection structure is provided.

In the above manufacturing process, both upper copper interconnection 114 and via plug 112 are films comprising copper as a main component and can be formed by any of various deposition methods such as plating, CVD, and sputtering. These films may contain, in addition to copper, Sn, Al, Ti, Ag, Ni and Mg as appropriate.

In the above manufacturing process, the SiOC film may be deposited by, for example, CVD or sputtering.

In the above manufacturing process, the SiCN film 113 acts as an etching inhibiting film when forming the interconnect trench as well as prevents components such as copper from diffusing from the via plug 112. Although SiCN is used herein, another material such as SiC, SiN and SiON may be used.

Although being unshown and not described in FIGS. 2A to 3B, the sides and the bottoms of the upper copper interconnection 114 and of the via plug 112 are coated with a barrier metal film. The barrier metal film may be made of a material containing a high melting metal such as Ti, TiN, W, WN, Ta and TaN, or alternatively may be a multilayer film in which layers of two or more of these metals are layered. The barrier metal film may be formed by an appropriate technique such as sputtering and CVD.

EXAMPLES

Example 1

In this example, an SiOC film deposited on a copper film was dry-etched to form a hole reaching the copper film, the inside of the hole was washed with a given stripper, and then cleaning performance for contaminants and damage on the film were evaluated.

(i) Sample Preparation

The processes illustrated in FIGS. 2A to 3B were conducted to prepare a sample. Specifically, in a copper film was formed an interconnect trench, residues dry etching were removed and the product was rinsed to give a sample. The copper film was deposited by plating. SiOC film was formed by CVD.

The following strippers (NOs. 1 to 4) were used.

Stripper NOs. 1 and 2 comprising an amine, an organic solvent, water, an anticorrosive and an organic acid. The organic acid was added for adjusting pH;

Stripper NO. 3 comprising ammonium fluoride, an organic solvent, water, an anticorrosive and an organic acid; and Stripper NO. 4 comprising an amine (strong alkali), an organic solvent, water, an anticorrosive and an organic acid.

pH values of these strippers as determined by a pH meter are shown in Table 1. Treatment with a stripper was conducted at room temperature for 10 min.

All samples were rinsed with IPA (isopropyl alcohol) alone.

(ii) Evaluation

Deposit Removal

Removal of a deposit within an interconnect trench was evaluated by SEM observation.

⊚: No deposit;

○: Little deposit;

Δ: A small amount of deposit;

×: A large amount of deposit

Damage on an Insulating Film

Damage on an insulating film (SiOC film) within an interconnect trench was evaluated by SEM observation.

○: Little damage;

Δ: Minor side etching of the SiOC film;

×: Significant side etching of the SiOC film.

Damage on a Copper Film

Damage on a copper film exposed in the bottom of an interconnect trench was evaluated by SEM observation.

○: Little damage;

Δ: Minor damage;

×: Significant damage.

Residues on a Copper Surface After Rinsing

After rinsing, presence of residues on a copper film was observed by SEM.

○: Little stain after rinsing;

Δ: Minor stain after rinsing;

×: Significant stain after rinsing.

Adhering Particle Count After Rinsing

After rinsing, particles remaining within an interconnect trench are counted under SEM observation.

(iii) Results

Figure 8:
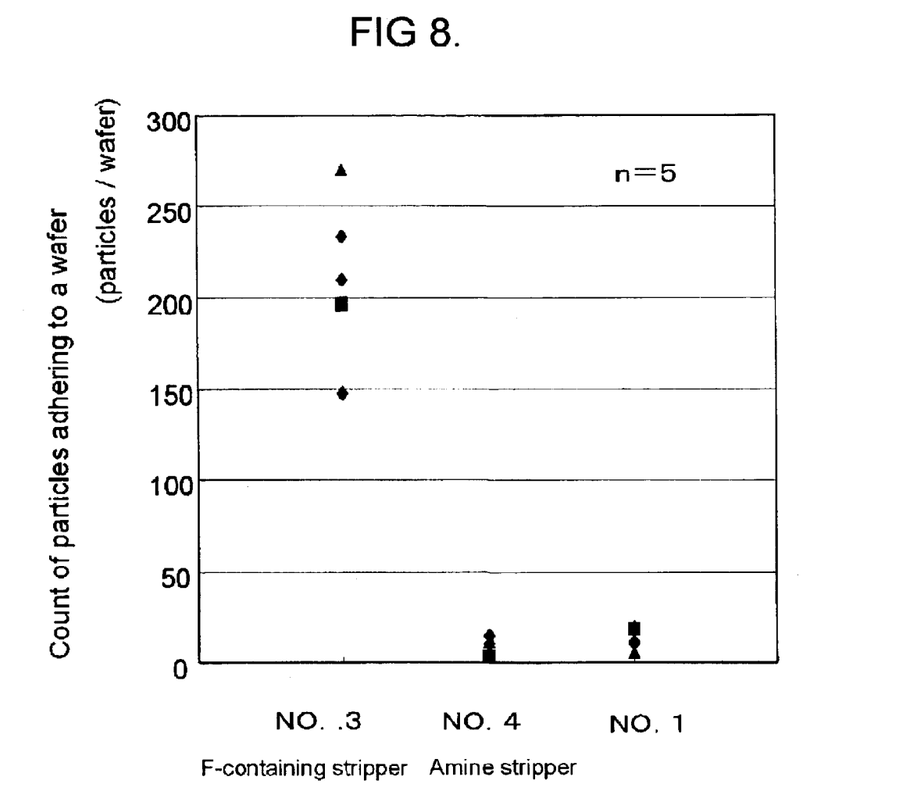
FIG. 8 shows the results of counting particles adhering to a wafer after rinsing in Example 1.

Table 1 shows the results for these evaluation parameters. FIG. 8 shows the results of counting particles adhering to the wafer after rinsing. These results indicate that a fluoride-free weak alkaline stripper (NOs. 1 and 2) can be used to prevent damage,on the film and residue formation after rinsing and also to effectively remove etching residues.

TABLE 1

| Stripper NO. | NO.1 | NO.2 | NO.3 | NO.4 |
| --- | --- | --- | --- | --- |
| Stripper pH | 8 | 11 | 5–6 | 12 |
| Fluoride in a stripper | Absent | Absent | Present | Absent |
| Removal of deposit | ⊚ | ○ | Δ | Δ |
| Damage on a copper film | ○ | ○ | ○ | ○ |
| Damage on an insulating film | ○ | ○ | X | Δ |
| Residues on a copper surface after rinsing | ○ | ○ | X | X |
| Adhering particle count after rinsing (particles per wafer) | ≦50 | ≦50 | 150–270 | ≦50 |

Example 2

In this example, a number of via holes were formed in a silicon wafer and then contamination in the surface of a copper film was evaluated. A sample preparation procedure in this example will be described with reference to FIGS. 11A to 12B.

Figure 11A:
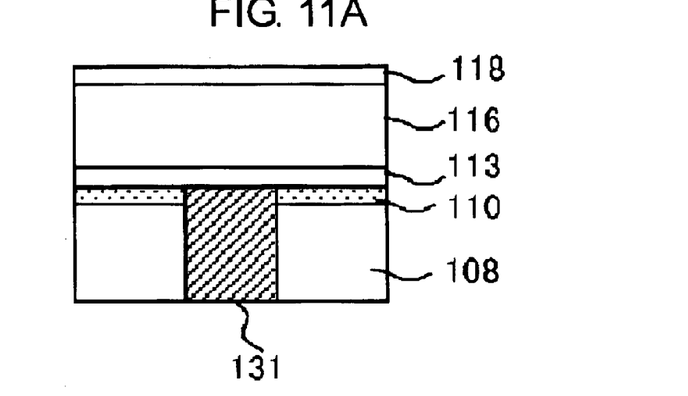
FIG. 11A shows a procedure for preparing a sample in Example 2.

First, as shown in FIG. 11A, on a semiconductor substrate (unshown) were formed an SiOC film 108 and an SiO$_2$ film 110, and in these multilayered films was formed a via plug 131 made of copper by damascene process. Then, on the surface were sequentially deposited an SiCN film 113, an SiOC film 116 and an SiO$_2$ film 118 by CVD.

Figure 11B:
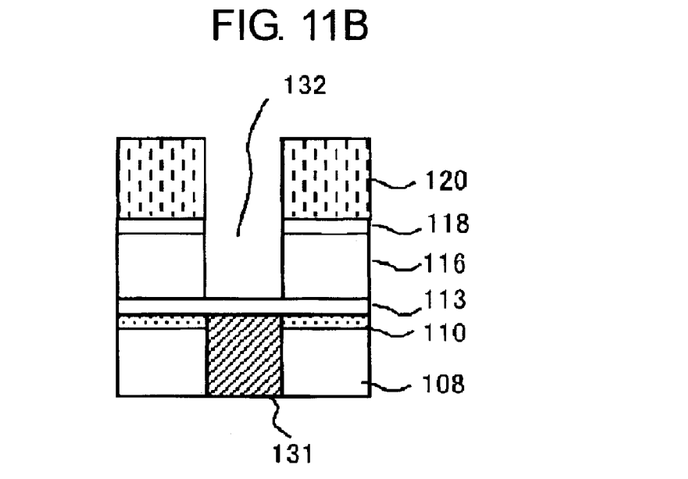
FIG. 11B shows a procedure for preparing a sample in Example 2.
Figure 11C:
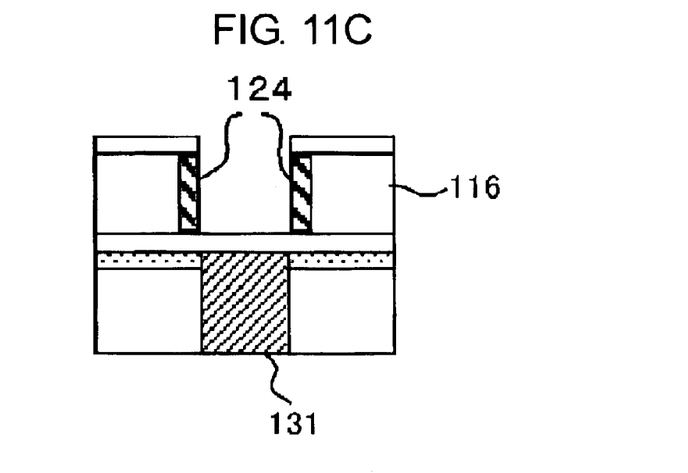
FIG. 11C shows a procedure for preparing a sample in Example 2.

Then, on the SiO$_2$ film 118 was formed a resist 120 having a given opening. Using the resist as a mask, the SiO$_2$ film 118 and the SiOC film 116 were dry-etched (FIG. 11B). At the end of etching, ashing by oxygen plasma was conducted to remove the resist 120 (FIG. 11C). During this process, the SiOC film 116 exposed within the interconnect trench was modified to form a modified layer 124.

Figure 12A:
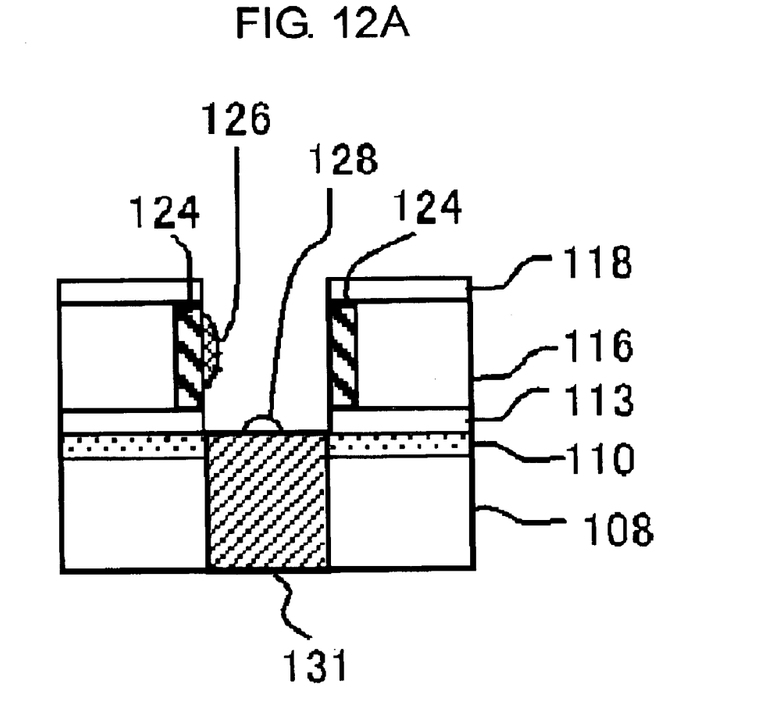
FIG. 12A shows a procedure for preparing a sample in Example 2.

Then, the SiCN film 113 in the bottom of the hole was removed by dry etching (FIG. 12A). Thus, the upper surface of the via plug 131 was exposed in the bottom of the hole. This etching allows residues 126 and 128 to adhere to the inside of the interconnect trench.

Figure 12B:
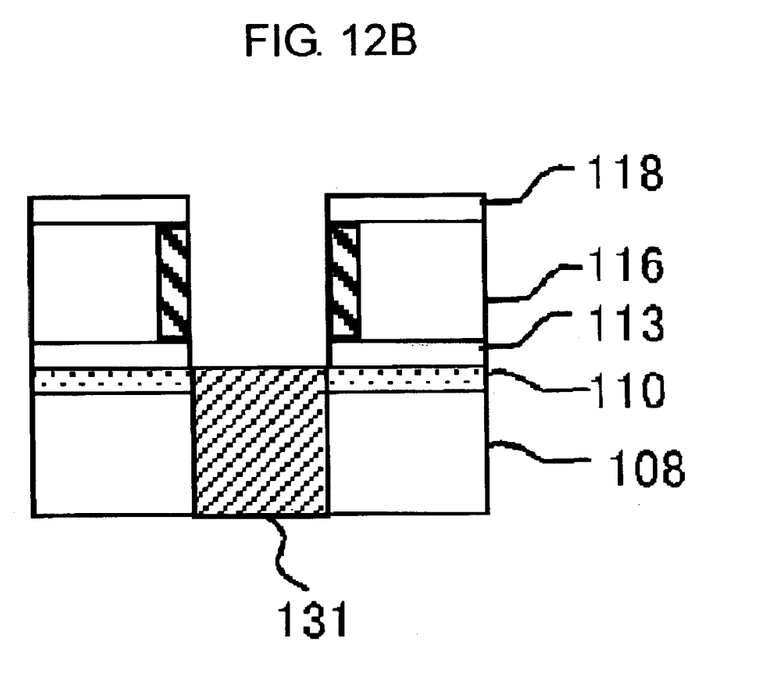
FIG. 12B shows a procedure for preparing a sample in Example 2.

Then, a stripper was used to remove the residues (FIG. 12B). Two samples were prepared by using Stripper NOs. 1 and 4 shown in Table 1 as a stripper. After the substrate was rinsed with IPA and dried, the samples were evaluated.

The samples thus obtained and a sample prepared omitting stripper treatment and rinsing were observed by SEM and analyzed by XPS (X-ray photoelectron spectroscopy).

Figure 13:
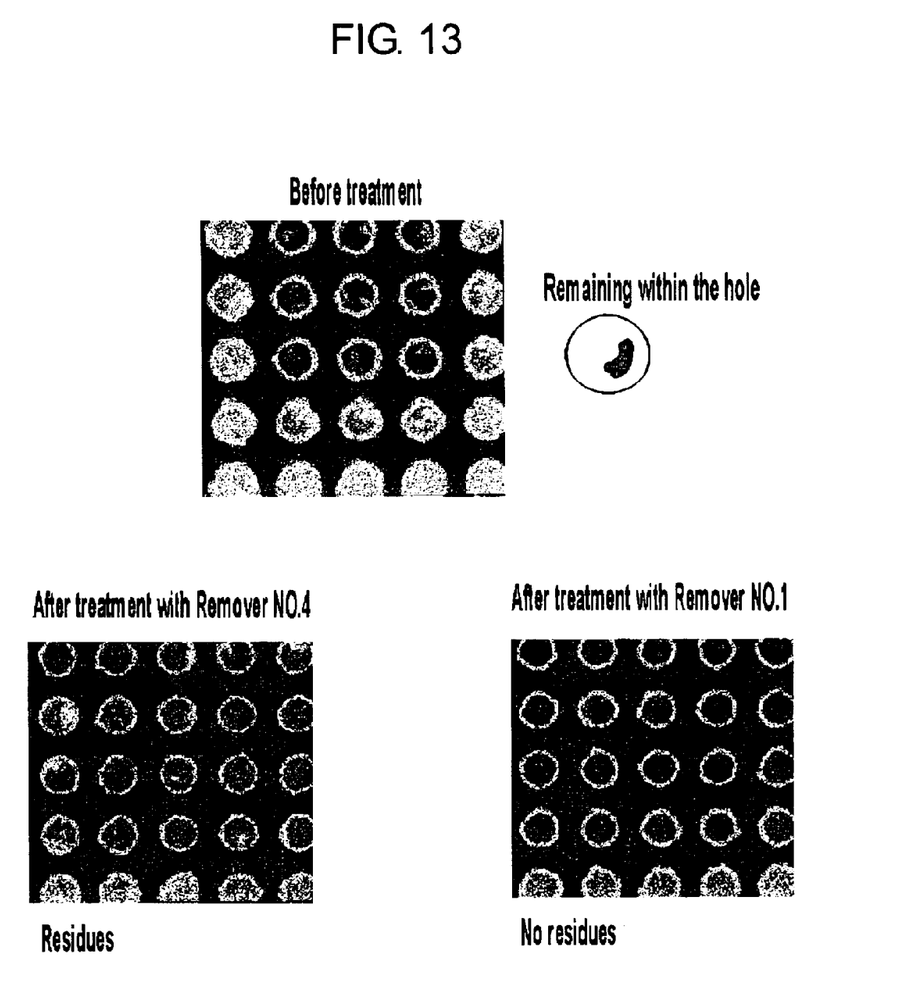
FIG. 13 shows the SEM observation results for a copper film surface in Example 2.

FIG. 13 shows the SEM observation results. The results indicate that the sample prepared using Stripper NO. 4 which is strongly alkaline failed to adequately stripperesidues on the copper film surface. In contrast, residues on the copper film surface were adequately removed in the sample prepared using Stripper NO. 1.

Figure 7:
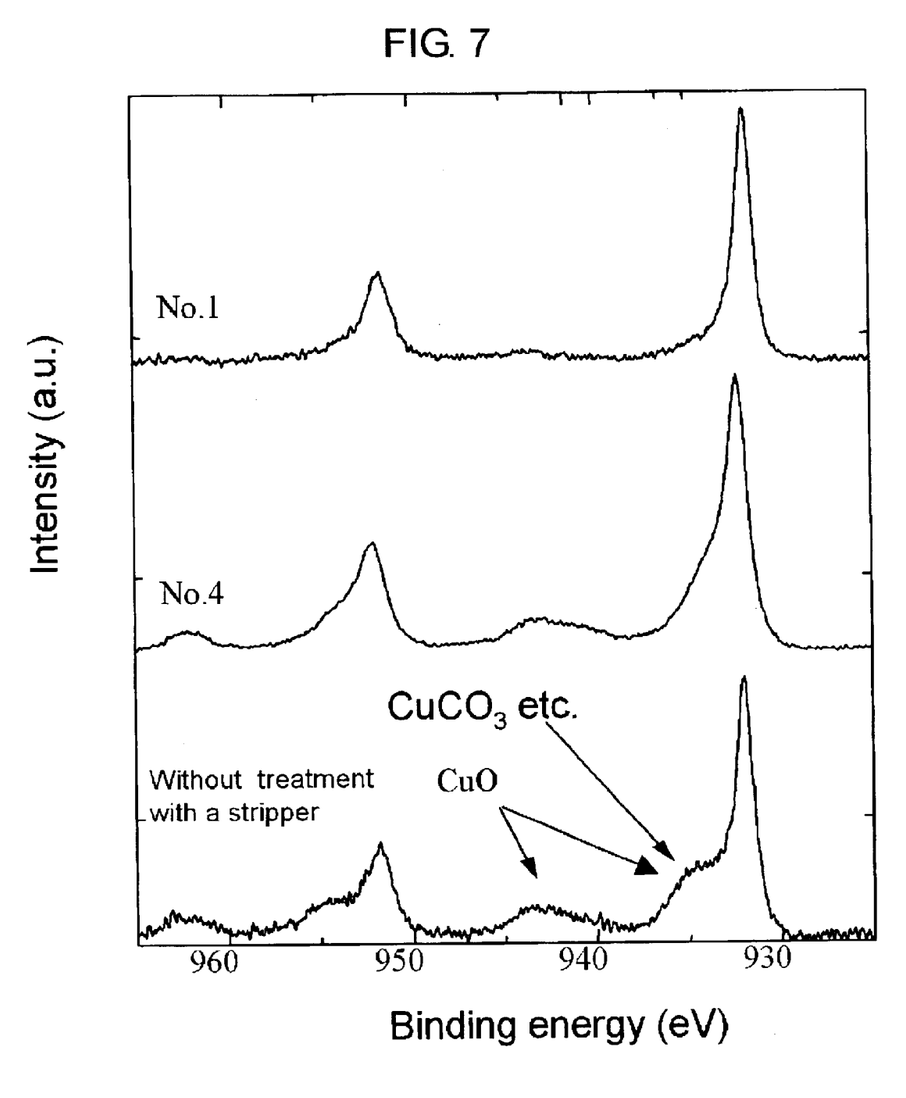
FIG. 7 shows the results of contamination analysis for a copper film surface by XPS in Example 2.

FIG. 7 shows the XPS analysis results for a copper film surface. In the sample prepared using Stripper NO. 4, peaks corresponding to contaminants such as CuO remain as are in the untreated sample. These peaks probably represent the presence of copper-containing contaminants adhering to the Cu surface. In contrast, in the sample prepared using Stripper NO. 1, such peaks corresponding to contaminants such as CuO disappear. These experimental results indicate that a stripper according to this invention may be used to significantly reduce copper compounds on a copper film surface.

Comparative Example

Figure 6:
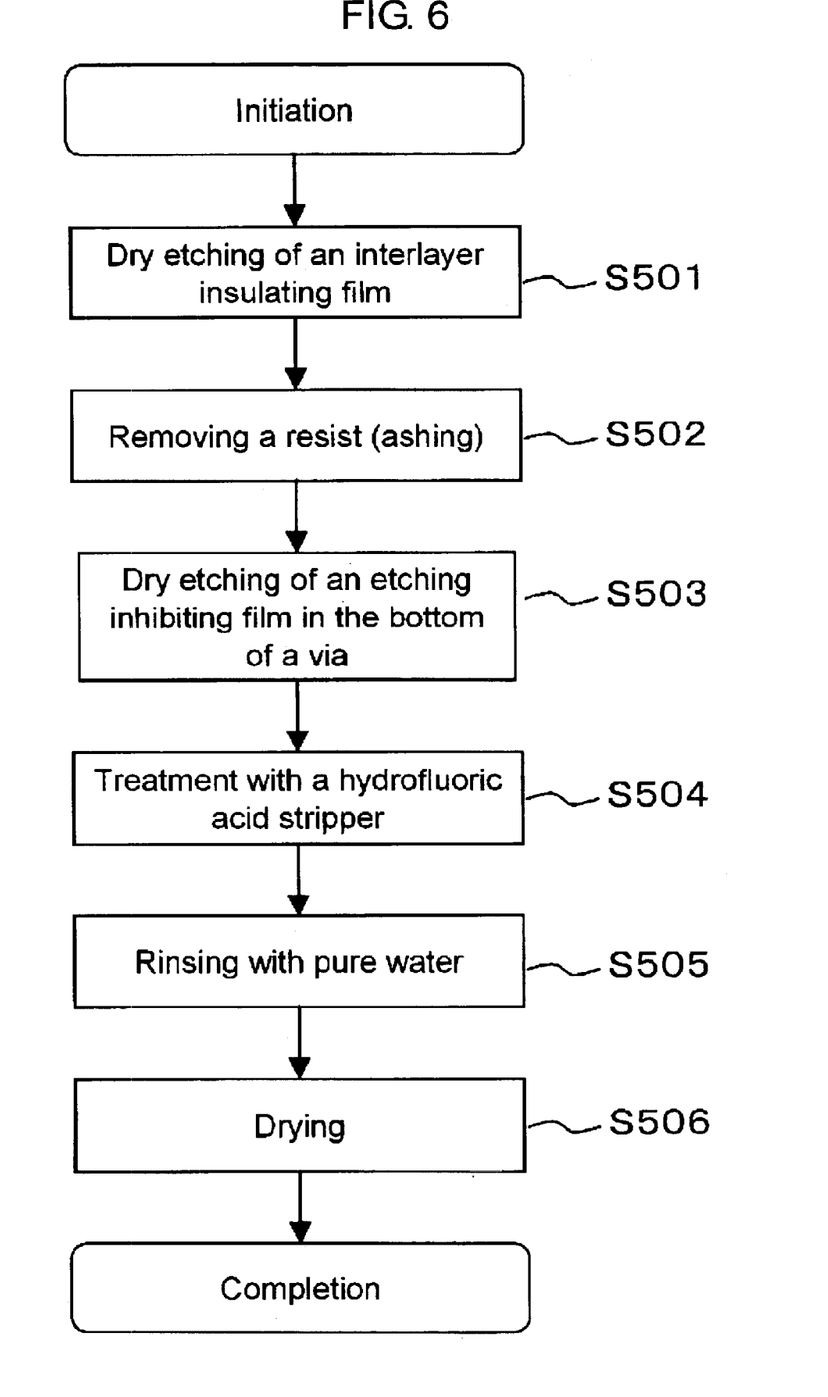
FIG. 6 is a flow diagram illustrating a process for manufacturing a semiconductor device using a hydrofluoric acid stripper.

After etching a hole as described in Example 2, residues were removed by a stripper containing ammonium fluoride and the substrate was rinsed with pure water. FIG. 6 shows the sample preparation procedure. First, on a semiconductor substrate were deposited an etching inhibiting film made of SiCN and an interlayer insulating film made of SiOC. On the surface was formed a resist having a given shape. Using the resist as a mask, the interlayer insulating film was dry-etched to form a via hole (S501). Then, after removing the resist by ashing (S502), the etching inhibiting film in the bottom of the via hole was removed by dry etching (S503). Then, the inside of the via hole was treated with a hydrofluoric acid stripper (S504) and rinsed with pure water (S505), and then the wafer was dried (5506).

After these processes, it was observed that dendrites were formed from the copper surface in some of a number of holes formed in the wafer.

Example 3

Figure 9:
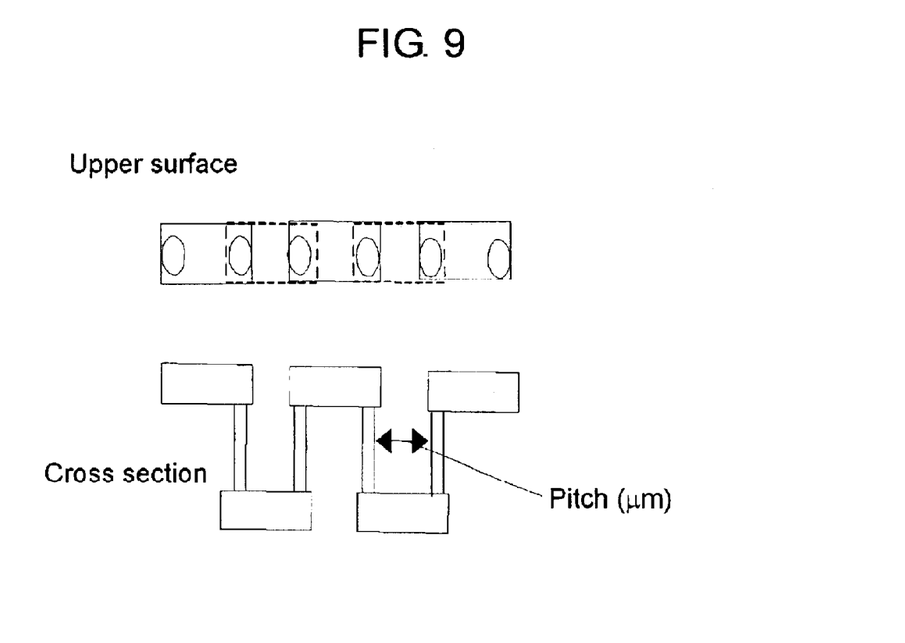
FIG. 9 illustrates a measurement model for a chain resistance evaluated in Example 3.

A two-layer interconnection structure as shown in FIG. 9 was prepared as described in Example 1 for an yield test. The wafers prepared using Stripper NOs. 1 and 4 were evaluated.

The two-layer interconnection structure is known as a via chain consisting of 500,000 vias and upper and lower interconnections. All of the interconnections and the vias are made of copper. Applying a given voltage between the ends of the via chain, an electric resistance is determined for an interconnection consisting of the interconnections and the vias. The resistance is referred to as a "chain resistance". A chain resistance is an effective measure for determining quality of via connection. In this example, a via chain described above was formed in each chip on a silicon wafer and a resistance was determined for each via chain. A chip is passed when a measurement is below a standard value while being rejected when a measurement is higher than the standard value. A via yield was determined as a proportion of passed chips to the total chips.

Figure 10:
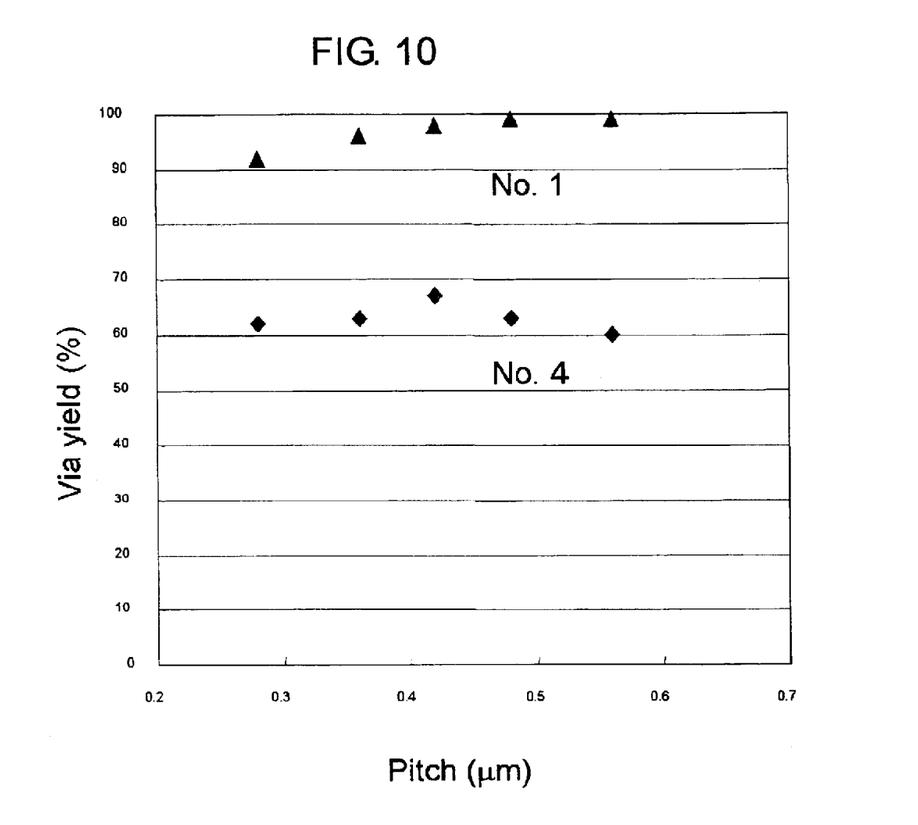
FIG. 10 shows the measurement results for a chain resistance in Example 3.

The evaluation results are shown in FIG. 10. A via yield little depended on a pitch and was substantially constant. A sample prepared using Stripper NO. 1 exhibited a higher yield than that prepared using Stripper NO. 4.

As described above, according to this invention, residues generated during selectively removing a low-dielectric-constant film such as SiOC are removed using a fluoride-free weak alkaline stripper so that the residues can be effectively removed without damage on an insulating film or metal film.

Although the present invention has been described by way of exemplary embodiments, it should be understood that many changes and substitutions may be made by those skilled in the art without departing from the spirit and the scope of the present invention which is defined only by the appended claims.

What is claimed is:

1. A process for manufacturing a semiconductor device comprising:

forming an SiOC-containing insulating film on a semiconductor substrate;

selectively removing the insulating film; and removing residue a generated during said selectively removing said insulating film with a fluoride-free weak alkaline stripper.

2. A process for manufacturing a semiconductor device comprising:

forming an insulating film having a specific dielectric of not greater than 4 on a semiconductor substrate by one of CVD and sputtering;

selectively removing the insulating film; and removing residue a generated during said selectively removing said insulating film with a fluoride-free weak alkaline stripper.

3. The process for manufacturing a semiconductor device as claimed in claim 2, wherein the insulating film comprises silicon and carbon as constituent elements.

4. The process for manufacturing a semiconductor device as claimed in claim 1, wherein the stripper has a pH within a range of more than 7 and not greater than 11.

5. The process for manufacturing a semiconductor device as claimed in claim 2, where in the stripper has a pH within a range of more than 7 and not greater than 11.

6. The process for manufacturing a semiconductor device as claimed in claim 1, wherein the stripper comprises an amine.

7. The process for manufacturing a semiconductor device as claimed in claim 2, wherein the stripper comprises an amine.

8. The process for manufacturing a semiconductor device as claimed in claim 1, wherein said selectively removing the insulating film comprises:

forming a resist having an opening on the insulating film;

selectively removing the insulating film using the resist as a mask; and removing at least part of the resist by ashing.

9. The process for manufacturing a semiconductor device as claimed in claim 2, wherein said selectively removing the insulating film comprises:

forming a resist having an opening on the insulating film;

selectively removing the insulating film using the resist as a mask; and removing at least part of the resist by ashing.

10. The process for manufacturing a semiconductor device as claimed in claim 1, further comprising:

rinsing the product using a non-aqueous rinse agent alone after removing the residue.

11. The process for manufacturing a semiconductor device as claimed in claim 2, further comprising:

rinsing the product using a non-aqueous rinse agent alone after removing the residue.

12. A process for manufacturing a semiconductor device comprising:

forming a copper-containing metal film and then an SiOC-containing insulating film on a semiconductor substrate;

selectively removing the insulating film to form a concave such that part of the copper-containing film is exposed; and removing a residue generated during said selectively removing the insulating film with a fluoride-free weak alkaline stripper.

13. A process for manufacturing a semiconductor device comprising:

forming a copper-containing metal film on a semiconductor substrate and then an insulating film having a specific dielectric constant of not greater than 4 by one of CVD and sputtering;

selectively removing the insulating film to form a concave such that a part of the copper-containing film is exposed; and removing a residue generated during said selectively removing the insulating film with a fluoride-free weak alkaline stripper.

14. The process for manufacturing a semiconductor device as claimed in claim 13, wherein the insulating film comprises silicon and carbon as constituent elements.

15. The process for manufacturing a semiconductor device as claimed in claim 12, wherein the stripper has a pH within a range of more than 7 and not greater than 11.

16. The process for manufacturing a semiconductor device as claimed in claim 13, wherein the stripper has a pH within a range of more than 7 and not greater than 11.

17. The process for manufacturing a semiconductor device as claimed in claim 12, wherein the stripper comprises an amine.

18. The process for manufacturing a semiconductor device as claimed in claim 13, wherein the stripper comprises an amine.

19. The process for manufacturing a semiconductor device as claimed in claim 12, wherein said selectively removing the insulating film comprises;

forming a resist having an opening on the insulating film;

selectively removing the insulating film using the resist as a mask; and removing at least part of the resist by ashing.

20. The process for manufacturing a semiconductor device as claimed in claim 13, wherein said selectively removing the insulating film comprises:

forming a resist having an opening on the insulating film;

selectively removing the insulating film using the resist as a mask; and removing at least part of the resist by ashing.

21. The process for manufacturing a semiconductor device as claimed in claim 12, further comprising:

rinsing the product using a non-aqueous rinse agent alone after removing the residue.

22. The process for manufacturing a semiconductor device as claimed in claim 13, further comprising:

rinsing the product using a non-aqueous rinse agent alone after removing the residue.

23. The process for manufacturing a semiconductor device according to claim 1, wherein said stripper comprises a stripper that does not dissolve said SiOC-containing insulating film.

24. The process for manufacturing a semiconductor device according to claim 1, wherein said fluoride-free weak alkaline stripper comprises a mixture of an amine, an organic solvent, water, an anticorrosive and an organic acid.

25. The process for manufacturing a semiconductor device according to claim 1, wherein said selectively removing said insulating film comprises dry etching said insulating film.

* * * * *